(12) United States Patent
Huang et al.

(10) Patent No.: US 8,780,510 B2
(45) Date of Patent: Jul. 15, 2014

(54) PASSIVE QUENCH PROTECTION CIRCUIT FOR SUPERCONDUCTING MAGNETS

(75) Inventors: Xianrui Huang, Clifton Park, NY (US); Anbo Wu, Shanghai (CN); Yan Zhao, Niskayuna, NY (US); Chao Yang, Shanghai (CN)

(73) Assignee: General Electric Company, Niskayuna, NY (US)

( * ) Notice: Subject to any disclaimer, the term of this patent is extended or adjusted under 35 U.S.C. 154(b) by 630 days.

(21) Appl. No.: 12/565,343

(22) Filed: Sep. 23, 2009

(65) Prior Publication Data

US 2011/0069418 A1   Mar. 24, 2011

(51) Int. Cl.
*H02H 9/00* (2006.01)
*H02H 7/00* (2006.01)

(52) U.S. Cl.
CPC ................................. *H02H 7/001* (2013.01)
USPC ............................................................ 361/19

(58) Field of Classification Search
CPC ........ H02H 7/001; H02H 9/023; Y02E 40/68; Y02E 40/69; H01F 6/02
USPC ............................................................ 361/19
See application file for complete search history.

(56) References Cited

U.S. PATENT DOCUMENTS

| | | | |
|---|---|---|---|
| 4,388,603 A * | 6/1983 | Hassler et al. | 337/158 |
| 4,689,707 A | 8/1987 | Schwall | |
| 4,956,740 A | 9/1990 | Williams | |
| 5,644,233 A | 7/1997 | Bird et al. | |
| 5,650,903 A | 7/1997 | Gross et al. | |
| 6,147,844 A | 11/2000 | Huang et al. | |
| 6,184,660 B1 * | 2/2001 | Hatular | 320/141 |
| 2005/0231859 A1 * | 10/2005 | Huang | 361/19 |
| 2006/0176132 A1 * | 8/2006 | Atkins et al. | 335/216 |
| 2006/0291112 A1 | 12/2006 | Markiewicze et al. | |
| 2007/0159863 A1 * | 7/2007 | Lu | 363/84 |
| 2008/0164877 A1 | 7/2008 | Huang et al. | |
| 2009/0103217 A1 | 4/2009 | Langtry et al. | |

FOREIGN PATENT DOCUMENTS

| | | |
|---|---|---|
| EP | 758811 A2 | 2/1997 |
| GB | 2422958 A | 8/2006 |
| GB | 2470063 A | 11/2010 |

OTHER PUBLICATIONS

Intellectual Property Office Search Report dated Jan. 17, 2011.
Schultz, J.H., Protection of superconducting magnets, Mar. 2002, pp. 1390-1395, IEEE Transactions on Applied Superconductivity, vol. 12, Issue 1.

\* cited by examiner

*Primary Examiner* — Jared Fureman
*Assistant Examiner* — Nicholas Ieva
(74) *Attorney, Agent, or Firm* — Robert M. McCarthy

(57) ABSTRACT

A superconducting magnet apparatus that in one embodiment includes at least one superconducting coil and a passive quench protection circuit electrically coupled to the coil in parallel. The circuit includes a heater and a current limiter connected in series. The heater is thermally coupled to the coil and the current limiter blocks current through the circuit at a current lower than the current rating of the heater.

17 Claims, 2 Drawing Sheets

PASSIVE QUENCH PROTECTION CIRCUIT FOR SUPERCONDUCTING MAGNETS

FIELD OF THE INVENTION

The subject matter disclosed herein relates to passive quench protection circuits for superconducting magnets including for magnetic resonance imaging (MRI) superconducting magnets.

BACKGROUND OF THE INVENTION

Superconducting magnets conduct electricity with effectively zero resistance as long as magnets are maintained at a suitably low temperature. However, if there is a thermal disturbance, the magnets become normal (no longer superconducting) and develop a resistance, causing the current to decay rapidly converting the stored magnetic energy into heat via $I^2R$ heat loss. This is an irreversible action known as quenching, which can cause undesirable heat and voltage that can damage the magnets.

Accordingly, a new apparatus and method is needed to prevent damage during a quench event.

BRIEF DESCRIPTION OF THE INVENTION

Embodiments of the invention provide a passive quench protection system and a superconducting magnet apparatus incorporating the same.

In one embodiment, the passive quench protection system is adapted for electrical connection to at least one superconducting coil. The circuit comprises a heater and a current limiter connected in series with the heater being adapted for thermal coupling to at least one of the superconducting coils. The current limiter blocks current through the circuit at a current lower than the current rating of the heater.

In another embodiment, the apparatus comprises at least one superconducting coil and a passive quench protection circuit electrically coupled to at least one of the coils in parallel. The circuit includes a heater and a current limiter connected in series. The heater is thermally coupled to at least one of the coils and the current limiter blocks current through the circuit at a current lower than the current rating of the heater.

Accordingly, the quench protection circuit can provide adequate quench protection for a superconducting coil while preventing damage to heaters.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Figure 1:
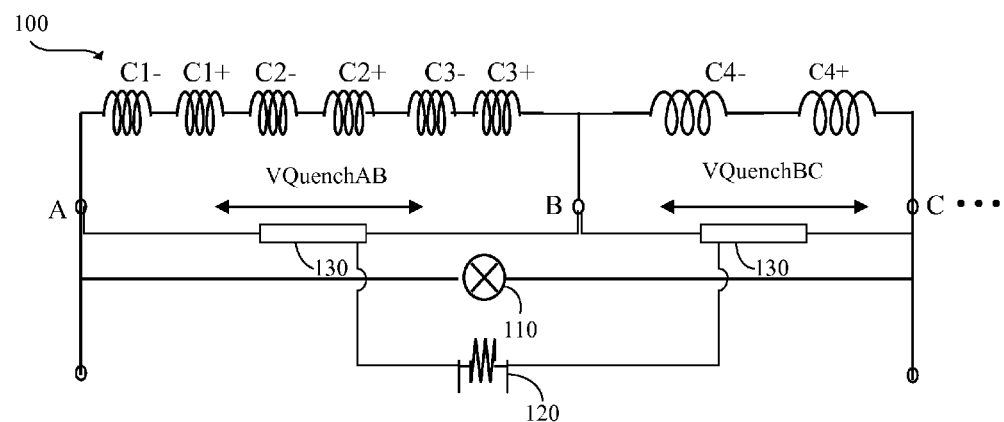
FIG. 1 is a circuit diagram illustrating a superconducting magnet apparatus according to an embodiment of the invention.

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Embodiments of the superconducting magnetic apparatus provide a quench protection circuit comprising at least one electric heater and at least one current limiter. In one embodiment, the circuit also includes at least one voltage blocker/filter. These three elements are connected in series and then shunted with properly grouped superconducting coils or groups of superconducting coils. The heaters are thermally coupled with one or more of the superconducting coils. Once a quench event occurs, the increasing quench voltage across the superconducting coils will power the heater, which then heats up and normalizes the superconducting coils at the heater regions, thereby spreading the energy around and preventing damage to the magnets. The current limiter provides over-current protection to limit the maximum heater current. That is, the current limiter has a currency rating lower than the currency rating of the heater. The voltage blocker prevents unwanted current conducting through the quench protection circuit when the coil voltage is under a preset threshold voltage. The threshold voltage is larger than the ramp voltage and the maximum voltages across the superconducting coils during magnet normal operations and reduces or eliminates the unwanted current flowing in the quench protection circuit.

In one embodiment, the current limiter can include a fast-acting thermal fuse and/or a Positive Temperature Coefficient (PTC) resistor. The fuse can be burnt at a certain current level that is lower than the current rating of the heater. The electric resistance of PTC heater is dependent on its temperature. The resistance will increase sharply once its temperature rises over its protection temperature. As the current in the heater circuit increases under increasing coil quench voltages, raising the temperature of the PTC resistor, followed by rising resistance of the PTC resistor to limit the heater current. The fuses or PTC resistors can be placed outside of the magnet so that they are easy to check and replace, if needed, after a magnet quench.

In an embodiment, to eliminate unwanted currents in the heater circuit during magnet ramps and magnet normal operations, a voltage blocker is connected in-series with the heater. The voltage blocker can include a pair of back-to-back in series connected Zener diodes or a Metal Oxide Semiconductor Field Effect Transistor (MOSFET). The backward breakdown voltage of the Zener diodes is selected or controlled to be higher than the maximum voltages during magnet normal operations and yet low enough for the heater to act during a magnet quench. The diodes or MOSFET can be place either inside or outside of the magnet.

FIG. 1 is a circuit diagram illustrating a superconducting magnet apparatus 100 according to an embodiment of the invention. The apparatus 100 comprises two sets of superconducting coils. The first set 102 includes coils C1−, C1+, C2−, C2+, C3−, and C3+ connected in series. The second set 104 comprises superconducting coils C4− and C4+ in series. In a further embodiment, the apparatus 100 may include additional sets of superconducting coils. Further, each superconducting coil set 102, 104 may include additional or fewer coils within each set.

Connected in parallel to the sets of coils 102, 104 is a ramp switch 110, which initially maintains a resistance, therefore causing current from a power supply (not shown) to feed into the coils 102, 104, and afterwards maintains a closed circuit with the coil sets once the coil sets are fully energized. The apparatus 100 also includes a Magnet Rundown Unit (MRU) 120 that in one embodiment is coupled to quench heater 210 (FIG. 2) of quench protection circuits 130. In an embodiment, the MRU 120 is coupled to other quench heaters (not shown). The MRU 120 can manually quench the coil sets 102, 104 in certain emergencies. The MRU 120 applies current to the quench heater 210 to force the coil sets to quench and lose magnetic energy.

Connected in parallel to the coil sets 102, 104 are the passive quench protection circuits 130. Each coil set 102, 104 can have one or more quench protection circuits 130 connected in parallel such as shown with at least one quench protection circuit 130 between terminals A and B and with at least one quench protection circuit 130 connected between terminals B and C. As previously noted, there may be additional superconducting coil sets (not shown) with corresponding quench protection circuits. Further, not each coil set need have the quench protection circuit 130. The quench protection circuit 130, which will be discussed in further detail below in conjunction with FIGS. 2, 3, 4, and 5, spreads the normal region among the coils in a coil set and/or among coil sets during a quench event so as to disburse energy more evenly, thereby preventing damage to any coils by overheating a local region.

Figure 2:
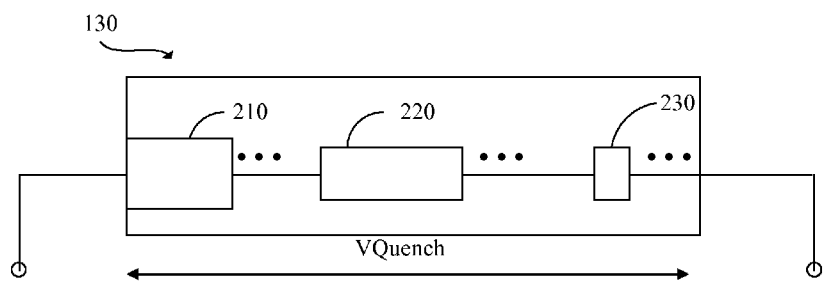
FIG. 2 is a circuit diagram of a quench protection circuit of FIG. 1.

Referring to FIGS. 1 and 2, during operation of the apparatus 100, the ramp switch 110 maintains some resistance thereby causing current to feed into the coils 102, 104 from the power supply (not shown) and then maintains a closed circuit once the coils are fully energized. As the coils 102, 104 are superconducting, current continuously flows through the coils, thereby maintaining a magnetic field used for imaging. If and when quenching occurs, such as from magnet coil frictional movement, the heated section of the wire becomes heated with normal resistance. After a superconducting coil quenches, the quench protection circuit 130 will see voltage across the respective superconducting coil set. This voltage is composed of two components: resistive voltage (I*R) due to normal zone resistance R of the coils and inductive voltage (Ldi/dt) due to current decay di/dt. If the total voltage exceeds the voltage blocker 230 (FIG. 2) threshold, the quench heater 210 will start to heat and spread the quench. The heater 210 will then more evenly distribute the energy via heat to other sections of the coil(s) or sets of coils, thereby preventing a local buildup of heat that could damage the coil, which is a desirable improvement compared to conventional circuitry. The quench heater 210 will typically quench the coil(s) within about 50 to about 200 milliseconds.

Referring again to FIG. 2 that illustrates a circuit diagram of the quench protection circuit 130 of FIG. 1. The circuit 130 comprises one or more quench heaters 210 coupled in series with one or more current limiters 220 and, optionally, one or more voltage filters/blockers 230. The quench heater 210 is thermally coupled with or physically built in with the superconducting coil. The current limiter 220 has non-linear resistance that limits the amount of current that can flow through the circuit 130, thereby preventing damage to the heater 210 from excessive current/overheating. The current limiter 220 can be located inside or outside of the magnet vacuum vessel of the superconducting magnetic apparatus 100. The current limiter 220 blocks currents through the circuit 130 at a current lower than the current rating of the heater 210. In embodiments described herein, the current limiters 220 may include one or more Positive Temperature Coefficient (PTC) resistors 310 (FIG. 3), fuses 410 (FIG. 4), automatic triggered circuit breakers, other devices, or a combination thereof. The current limiters 220 are typically inexpensive, easy to use, and easy to replace when located external to the apparatus 100.

The voltage blocker/filter 230 can be located either inside or outside of the magnet vacuum vessel of the superconducting magnetic apparatus 100. The voltage blocker/filter 230 provides backward protection of the voltage and filters gradient induced voltage noises in the superconducting coils. In the embodiments described herein, the voltage blocker/filter 230 may include shunted back-to-back power diodes, one or more back-to-back Zener diodes 320 (FIG. 3) coupled in series, Metal Oxide Semiconductor Field Effect Transistor (MOSFET) 510 (FIG. 5) with comparison circuit 520 (FIG. 5), or a combination thereof.

During a quench during operation of the apparatus 100, the quench heater 210 distributes heat as mentioned above. The current limiter 220 limits the current that can flow through the heater 210, thereby preventing the heaters from overheating and becoming defective from over current. The voltage blocker 230 blocks and/or filters current flowing to the heater 210 via the current limiter 220.

Figure 3:
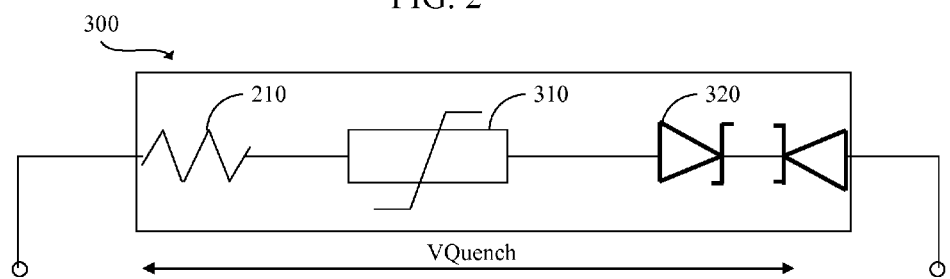
FIG. 3 is a circuit diagram of a quench protection circuit according to an embodiment of the invention.

FIG. 3 is a circuit diagram of a quench protection circuit 300 according to another embodiment. The quench protection circuit 300 includes one or more quench heaters 210 coupled in series with one or more PTC resistors 310 and one or more back-to-back Zener diodes 320 coupled in series. The PTC resistor 310 acts a current limiter and limits the maximum current of the heater 210. The resistance of the PTC resistor 310 increases exponentially when its temperature is increased above its curie temperature Tc due to overloaded current. In consequence, the maximum current through PTC resistor 310 is limited. According to one example, resistance can range from about 10 Ohms when under Tc to $10^7$ Ohms above Tc, with the exponential increase in resistance arising from about 20° C. to about 100° C. By way of illustration, a 4 Ohm PTC resistor will react and protect the quench heater 210 from over current within about 0.15 to about 0.2 seconds under a 50V DC voltage. The Zener diodes 320 filter gradient induced voltage noises in the coils and provide backwards voltage protection ranging from about 10V to about 50V in one embodiment.

During a quench event, the PTC resistor 310 heats up as current flows through it via the quench heater 210, thereby increasing the PTC resistor 310 temperature. The quench heater 210 may also increase the temperature of the PTC resistor 310. As the temperature rises, the PTC resistor 310 blocks current from passing through due to high resistance, thereby preventing the quench heater 210 from being damaged.

Figure 4:
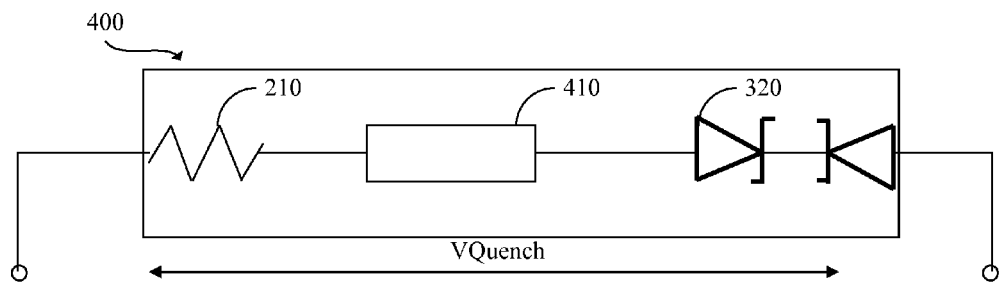
FIG. 4 is a circuit diagram of a quench protection circuit according to an embodiment of the invention.

FIG. 4 is a circuit diagram of a quench protection circuit 400 according to a further embodiment. The quench protection circuit 400 includes one or more quench heater 210 coupled in series with one or more fuses 410 and one or more back-to-back Zener diodes 320. The fuse 410 prevents the heater 210 from damage by over-current. In one aspect, during an over-current condition, the fuse 410 will burn out in about 0.1 to 0.3 seconds. The fuse 410 can be located external to the apparatus 100 so that it can be easily replaced if burned out. In one example, the fuse 410 includes a LITTELFUSE 0216.004 fast-acting fuse with a normal current of 4 Amps.

During a quench event, current flows through the quench heater 210 to the fuse 410. Once the current exceeds the fuse 410 tolerance, the fuse 410 burns out, thereby blocking current from entering the quench circuit 400 and preventing damage to the quench heater 210.

Figure 5:
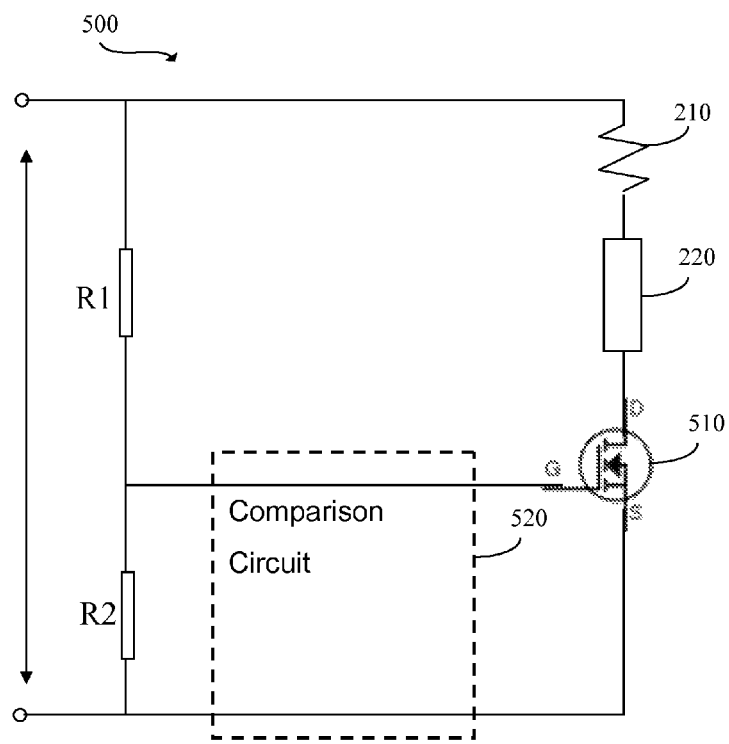
FIG. 5 is a circuit diagram of quench protection circuit according to an embodiment of the invention.

FIG. 5 is a circuit diagram of quench protection circuit 500 according to yet another embodiment. The quench protection circuit 500 includes one or more quench heaters 210 coupled in series with one or more current limiters 220 and one or MOSFETs 510. In addition, resistors R1 and R2 are disposed along a branch in parallel with MOSFET 510 forming a resistor divider network that is coupled to the gate of the MOSFET. Coupled between the R1/R2 resistor divider and the MOSFET 510 is a comparison circuit 520. The MOSFET 510 filters out unnecessary conducting current and cuts off heater current in a bipolar direction. R1 and R2 are resistors of the voltage divider, which is used to adjust the operating point of MOSFET 510.

Since the quench voltage can be either positive or negative, the MOSFET 510 conducts or cuts off heater current in a bipolar direction. Additional detailed comparison circuit is required between the voltage divider and MOSFET 510. The impedance of voltage divide ought to be very high (more than mega-ohm) to suppress unnecessary current in this branch.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A superconducting magnet apparatus, comprising:
   at least one superconducting coil; and
   a passive quench protection circuit directly electrically coupled to the at least one coil in parallel, the circuit comprising at least one heater, at least one current limiter, and at least one voltage blocker connected in series;
   wherein the heater is thermally coupled to the at least one coil; and wherein the heater is triggered when a voltage on the voltage blocker exceeds a threshold; and wherein the current limiter limits a maximum current flow through the circuit to the current rating of the heater to prevent damage to the heater during a quench operation.

2. The apparatus of claim 1, wherein the current limiter is located external to the apparatus.

3. The apparatus of claim 1, wherein the voltage blocker is located external to the apparatus.

4. The apparatus of claim 1, wherein the voltage blocker includes back-to-back Zener diodes.

5. The apparatus of claim 1, wherein the voltage blocker includes a MOSFET, a voltage divider, and a comparison circuit therebetween.

6. The apparatus of claim 1, wherein the current limiter includes a Positive Temperature Coefficient (PTC) resistor.

7. The apparatus of claim 1, wherein the current limiter includes a fuse.

8. The apparatus of claim 1, wherein the current limiter includes an automatic triggered circuit breaker.

9. The apparatus of claim 1, wherein the at least one superconducting coil comprises at least two groups of superconducting coils, each of said groups having one or more superconducting coils, wherein said passive quench protection circuit is coupled to each of said groups.

10. A passive quench protection circuit adapted for electrical connection to at least one superconducting coil, the circuit comprising:
    at least one heater, at least one current limiter, and at least one voltage blocker connected in series, wherein the circuit is directly electrically connected to all of the at least one superconducting coil in parallel, and the heater is adapted for thermal coupling to the at least one superconducting coil;
    wherein the heater is triggered when a voltage on the voltage blocker exceeds a threshold; and
    wherein the current limiter limits a maximum current flow through the circuit to the current rating of the heater to prevent damage to the heater during a quench operation.

11. The circuit of claim 10, wherein the voltage blocker includes back-to-back Zener diodes.

12. The circuit of claim 10, wherein the voltage blocker includes a MOSFET, a voltage divider, and a comparison circuit therebetween.

13. The circuit of claim 10, wherein the current limiter includes a Positive Temperature Coefficient (PTC) resistor.

14. The circuit of claim 10, wherein the current limiter includes a fuse.

15. The circuit of claim 10, wherein the current limiter includes an automatic triggered circuit breaker.

16. The circuit of claim 10, wherein the at least one superconducting coil comprises at least two groups of superconducting coils, each of said groups having one or more superconducting coils, wherein said passive quench protection circuit is coupled to each of said groups.

17. A method for quenching superconducting coils, comprising:
    directly electrically coupling a quench protection circuit in parallel to at least one group of superconducting coils, each of said groups having one or more superconducting coils, wherein said circuit comprises at least one heater, at least one current limiter, and at least one voltage blocker, wherein the at least one heater is adapted for thermal coupling to the superconducting coils;
    triggering a quench event caused by an increasing quench voltage across the superconducting coils;
    powering the heater when a voltage on the voltage blocker exceeds a threshold upon the quench event and normalizing the superconducting coils at heater regions; and
    limiting a current of the heater to a currency rating of the heater to prevent damage to the heater during a quench operation.

* * * * *